United States Patent
Kellerman et al.

(10) Patent No.: US 8,764,901 B2
(45) Date of Patent: Jul. 1, 2014

(54) REMOVING A SHEET FROM THE SURFACE OF A MELT USING ELASTICITY AND BUOYANCY

(75) Inventors: Peter L. Kellerman, Essex, MA (US); Dawei Sun, Nashua, NH (US); Brian Helenbrook, Potsdam, NY (US); David S. Harvey, Westford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 217 days.

(21) Appl. No.: 13/039,808

(22) Filed: Mar. 3, 2011

(65) Prior Publication Data
US 2011/0272115 A1 Nov. 10, 2011

Related U.S. Application Data

(60) Provisional application No. 61/332,062, filed on May 6, 2010.

(51) Int. Cl.
*C30B 15/06* (2006.01)
*C30B 15/00* (2006.01)
*C30B 15/20* (2006.01)
*C30B 15/22* (2006.01)

(52) U.S. Cl.
CPC .......... *C30B 15/00* (2013.01); *C30B 15/06* (2013.01); *C30B 15/20* (2013.01); *C30B 15/22* (2013.01)
USPC .......... 117/27; 117/11; 117/13; 117/23; 117/26; 117/30; 117/33; 117/34; 117/35; 117/73

(58) Field of Classification Search
CPC ........ C30B 15/00; C30B 15/06; C30B 15/20; C30B 15/22
USPC .......... 117/11, 13, 23, 26–27, 30, 33–35, 73, 117/902, 922, 931–932, 936
See application file for complete search history.

(56) References Cited

U.S. PATENT DOCUMENTS

| | | |
|---|---|---|
| 4,264,407 A | 4/1981 | Shudo et al. |
| 4,289,571 A | 9/1981 | Jewett |
| 4,322,263 A | 3/1982 | Kudo et al. |
| 4,329,195 A * | 5/1982 | Kudo .......................... 117/27 |
| 4,366,024 A | 12/1982 | Ast et al. |
| 4,417,944 A | 11/1983 | Jewett |

(Continued)

FOREIGN PATENT DOCUMENTS

| | | |
|---|---|---|
| AU | 7542681 A | 3/1983 |
| DE | 2633961 A1 | 2/1977 |

OTHER PUBLICATIONS

C.A. Rhodes, et al. publication entitled "Investigation of the meniscus stability in horizontal crystal ribbon growth," Journal of Crystal Growth, vol. 50, pp. 94-101 (1980).*

(Continued)

*Primary Examiner* — Michael Kornakov
*Assistant Examiner* — Kenneth A Bratland, Jr.

(57) ABSTRACT

Embodiments related to sheet production are disclosed. A melt of a material is cooled to form a sheet of the material on the melt. The sheet is formed in a first region at a first sheet height. The sheet is translated to a second region such that it has a second sheet height higher than the first sheet height. The sheet is then separated from the melt. A seed wafer may be used to form the sheet.

20 Claims, 9 Drawing Sheets

(56) References Cited

U.S. PATENT DOCUMENTS

| | | |
|---|---|---|
| 7,608,146 B2 | 10/2009 | Clark |
| 7,816,153 B2 | 10/2010 | Kellerman et al. |
| 7,855,087 B2 | 12/2010 | Kellerman et al. |
| 2009/0233396 A1 | 9/2009 | Kellerman et al. |
| 2010/0025885 A1 | 2/2010 | Clark |

OTHER PUBLICATIONS

D.N. Jewett et al., Progress in Growth of Silicon Ribbon by a Low Angle, High Rate Process, 1982, pp. 86-89, IEEE Photovoltaics Specialists Conference, IEEE.

C.A. Rhodes, M.M. Sarraf & C.H. Liu, "Investigation of the Meniscus Stability in Horizontal Crystal Growth", J. Crystal Growth, 1980, vol. 50, 94-101.

B. Kudo, "Improvements in the Horizontal Ribbon Growth Technique for Single Crystal Silicon," Journal of Crystal Growth 50, 1980, pp. 247-259, North-Holland Publishing Co., Amsterdam, Netherlands.

J.A. Zoutendyk & O. Vonroos, "Gas-Jet Meniscus Control in Ribbon Growth", NASA Tech. Briefs, Spring 1983, vol. 7, No. 3, Item #67, pp. 1-27.

\* cited by examiner

REMOVING A SHEET FROM THE SURFACE OF A MELT USING ELASTICITY AND BUOYANCY

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

CROSS-REFERENCE TO RELATED APPLICATIONS

This application claims priority to the provisional patent application entitled "Removing a Horizontal Sheet from the Surface of a Melt Using Elasticity and Buoyancy," filed May 6, 2010 and assigned U.S. App. No. 61/332,062, the disclosure of which is hereby incorporated by reference.

FIELD

This invention relates to sheet formation from a melt and, more particularly, to removing the sheet from the melt.

BACKGROUND

Silicon wafers or sheets may be used in, for example, the integrated circuit or solar cell industry. Demand for solar cells continues to increase as the demand for renewable energy sources increases. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. As the demand for solar cells increases, one goal of the solar cell industry is to lower the cost/power ratio. Any reduction in the cost of manufacturing a wafer without decreasing quality will lower the cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 µm thick. To maintain single crystal growth, the boule must be grown slowly, such as less than 10 µm/s, from a crucible containing a melt. The subsequent sawing process leads to approximately 200 µm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to ingot slicing technology may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries, which results in lower efficiency solar cells. The sawing process for a polycrystalline silicon ingot is as inefficient as a monocrystalline silicon ingot or boule.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 µm.

Producing sheets horizontally from a melt may be less expensive than silicon sliced from an ingot and may eliminate kerf loss or loss due to squaring. Sheets produced horizontally from a melt also may be less expensive than a silicon ribbon pulled vertically from a melt. Furthermore, sheets produced horizontally from a melt may improve the crystal quality of the sheet compared to silicon ribbons pulled vertically or at an angle from a is melt. A crystal growth method such as this that can reduce material costs would be a major enabling step to reduce the cost of silicon solar cells.

Horizontal ribbons of silicon that are physically pulled from a melt have been tested. In one method, a seed attached to a rod is inserted into the melt and the rod and resulting sheet are pulled at a low angle over the edge of the crucible. The angle, surface tension, and melt level are balanced to prevent the melt from spilling over the crucible. It is difficult, however, to initiate and control such a pulling process. First, the angle of inclination adjustment to balance gravity and surface tension of the meniscus formed at the crucible edge may be difficult. Second, a temperature gradient along the ribbon at the separation point between the sheet and the melt may cause dislocations in the crystal if the cooling plate is near this separation point. Third, inclining the sheet above the melt may result in stress at the freeze tip. This freeze tip may be where the sheet is thinnest and most fragile so dislocations or breaks in the sheet may occur. Fourth, a complex pulling apparatus may be needed to obtain the low angle.

The sheet must be removed from the melt surface without spilling the melt. Thus, the meniscus between the underside of the sheet and the melt must remain stable or attached to the vessel. Previously, pressure has been reduced in the melt to maintain the meniscus. In one example, Low Angle Silicon Sheet (LASS) inclined the sheet at a small angle and pulled up on the melt. This created negative pressure in the melt relative to atmospheric pressure and provided pressure against the meniscus. In another example, the melt may be flowed over the edge of a spillway. The drop in fluid in the nape of the spillway provides a negative pressure in the melt to stabilize the meniscus. Gas jets also may be used to increase local pressure on the meniscus. However, there is a need in the art for an improved method of removing a sheet from a melt and, more particularly, an improved method of removing a sheet from a melt using the elasticity of the sheet.

SUMMARY

According to a first aspect of the invention, a method of sheet production is provided. The method comprises cooling a melt of a material to form a sheet of the material on a surface of the melt. The sheet is formed in a first region at a first sheet height. The sheet is translated to a second region such that it has a second sheet height higher than the first sheet height. The sheet is separated from the melt.

According to a second aspect of the invention, a method of sheet production is provided. The method comprises inserting a seed wafer into a melt of a material. The melt has a surface at a first height that is higher than an edge of a vessel containing the melt. The seed wafer is translated in the melt to a region proximate a cooling plate. The surface of the melt is lowered to a second height below the first height. A sheet of the material is formed on the melt using the seed wafer in this region. The sheet and seed wafer are translated and the sheet is separated from the melt at an edge of the vessel.

According to a third aspect of the invention, a method of sheet production is provided. The method comprises inserting a seed wafer into a melt of a material. The melt has a surface at a first height that is equal to or lower than an edge of a vessel containing the melt. The seed wafer is translated to a region proximate a cooling plate. A sheet of the material is formed on the melt using the seed wafer. The sheet has a first sheet height proximate this region. The sheet and seed wafer are translated and the sheet is separated from the melt. The sheet has a second sheet height higher than the first sheet height after the separating.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, LEDs, or other substrates known to those skilled in the art. Furthermore, while the melt is described herein as being silicon, the melt may contain germanium, silicon and germanium, gallium, gallium nitride, other semiconductor materials, or other materials known to those skilled in the art. Thus, the invention is not limited to the specific embodiments described below.

Figure 1:
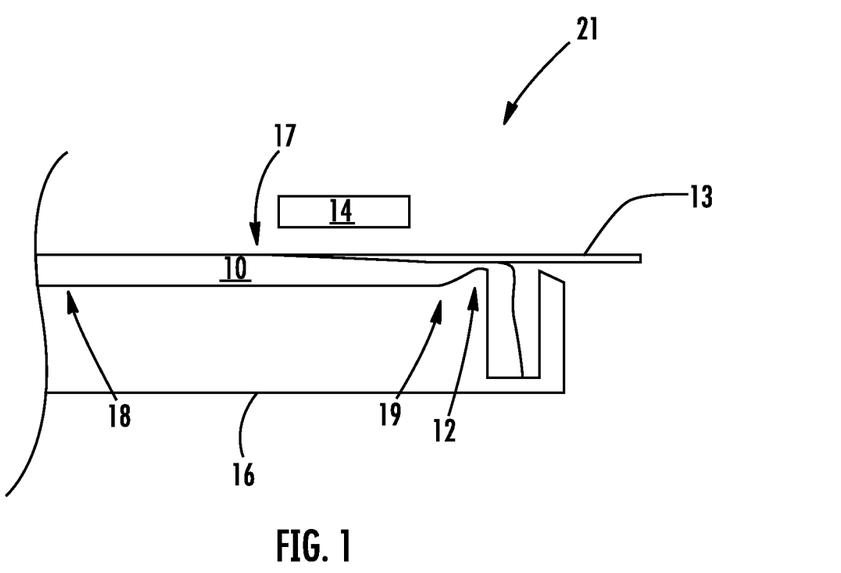
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16. The vessel 16 may be, for example, tungsten, boron nitride, aluminum nitride, molybdenum, graphite, silicon carbide, or quartz. The vessel 16 is configured to contain a melt 10. This melt 10 may be silicon. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. The depth at which the sheet 13 is located is based partly on the relative densities of the sheet 13 and melt 10. In one instance, only 10% of the sheet 13 protrudes from above the top of the melt 10. The melt 10 may circulate within the sheet-forming apparatus 21.

This vessel 16 defines at least one channel 17. This channel 17 is configured to hold the melt 10 and the melt 10 flows from a first point 18 to a second point 19 of the channel 17. The melt 10 may flow due to, for example, a pressure difference, gravity, a pump, or other methods of transport. The melt 10 then flows over the spillway 12. This spillway 12 may be a ramp, a weir, a ledge, a small dam, or a corner and is not limited to the embodiment illustrated in FIG. 1. The spillway 12 may be any shape that allows a sheet 13 to be separated from the melt 10.

In one particular embodiment, the vessel 16 may be maintained at a temperature slightly above approximately 1685 K. For silicon, 1685 K represents the freezing temperature or interface temperature. By maintaining the temperature of the vessel 16 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but also may include multiple segments or sections. The bottom of the channel 17 may be heated above the melting temperature of the melt 10 to create a small vertical temperature gradient in the melt 10 at the interface to prevent constitutional supercooling or the formation of dendrites, or branching projections, on the sheet 13. However, the vessel 16 may be any temperature above the melting temperature of the melt 10. This prevents the melt 10 from solidifying on the vessel 16.

The sheet-forming apparatus 21 may be maintained at a temperature slightly above the freezing temperature of the melt 10 by at least partially or totally enclosing the sheet-forming apparatus 21 within an enclosure. If the enclosure maintains the sheet-forming apparatus 21 at a temperature above the freezing temperature of the melt 10, the need to heat the sheet-forming apparatus 21 may be avoided or reduced and heaters in or around the enclosure may compensate for any heat loss. This enclosure may be isothermal with anisotropic conductivity. In another particular embodiment, the heaters are not disposed on or in the enclosure and are rather in the sheet-forming apparatus 21. In one instance, different regions of the vessel 16 may be heated to different temperatures by embedding heaters within the vessel 16 and using multi-zone temperature control.

The enclosure may control the environment where the sheet-forming apparatus 21 is disposed. In a specific embodiment, the enclosure contains an inert gas. This inert gas may be maintained at above the freezing temperature of the melt 10. The inert gas may reduce the addition of solutes into the melt 10 that may cause constitutional instabilities during the formation of the sheet 13.

The cooling plate 14 allows heat extraction that enables the sheet 13 to form on the melt 10. The cooling plate 14 may cause the sheet 13 to freeze on or in the melt 10 when the temperature of the cooling plate 14 is lowered below the freezing temperature of the melt 10. This cooling plate 14 may use radiation cooling and may be fabricated of, for example, graphite, quartz, or silicon carbide. Disturbances to the melt 10 may be reduced while the sheet 13 forms to prevent imperfections in the sheet 13. Cooling a sheet 13 on the surface of the melt 10 or a sheet 13 that floats on the melt 10 allows the latent heat of fusion to be removed slowly and over a large area while having a relatively large sheet 13 extraction rate.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking a sheet 13 because no external stress is applied to the sheet 13. Of course, the sheet 13 also may be pulled or have some external force applied. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions. The sheet 13 may tend to go straight beyond the spillway 12 in one embodiment. This sheet 13 may be supported after going over the spillway 12 in some instances to prevent breakage.

Figure 2:
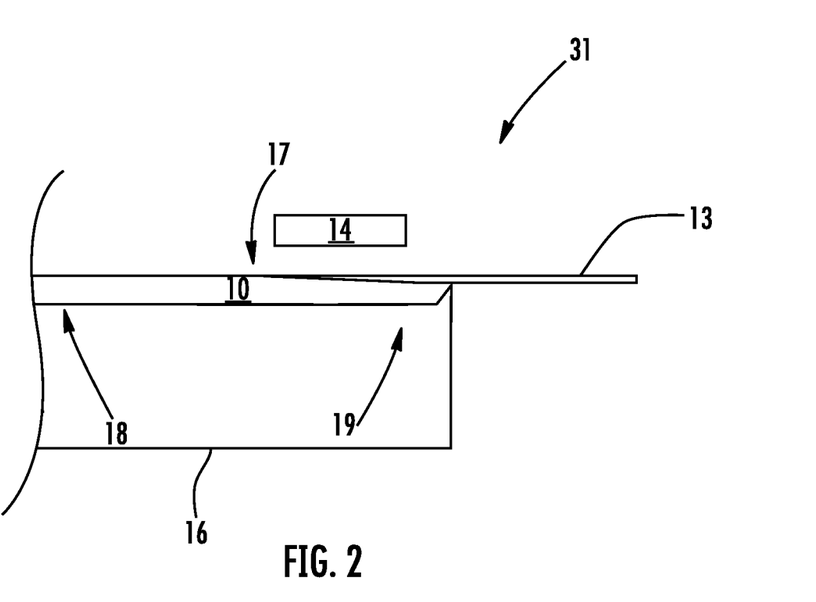
FIG. 2 is a cross-sectional side view of a second embodiment of an apparatus that separates a sheet from a melt.

Of course, different cooling temperatures across the length of the cooling plate 14, different flow rates of the melt 10 or pull speeds of the sheet 13, the length of the various sections of the sheet-forming apparatus 21, or the timing within the sheet-forming apparatus 21 may be used for process control. If the melt 10 is silicon, the sheet 13 may be polycrystalline or single crystal sheet using the sheet-forming apparatus 21. FIG. 1 is only one examples of a sheet-forming apparatus that can form a sheet 13 from a melt 10. Other apparatuses or methods of horizontal sheet 13 growth are possible. The embodiments described herein may be applied to any horizontal sheet 13 growth method or apparatus. Thus, the embodiments described herein are not limited solely to the specific embodiment of FIG. 1. For example, FIG. 2 is a cross-sectional side view of a second embodiment of an apparatus that separates a sheet from a melt. In the sheet-forming apparatus 31, the melt 13 is contained in the vessel 16. A sheet 13 is pulled from the melt 10 after formation by the cooling plate 14. While horizontal in FIG. 2, the sheet 13 also may be at an angle with respect to the melt 10. In the embodiments of FIGS. 1-2, the melt 10 may circulate around the sheet-forming apparatus 21 or sheet-forming apparatus 31, such as around the sides of the sheet-forming apparatus 21 or sheet-forming apparatus 31. Of course, the melt 10 also may be stationary during part or all of the sheet 13 formation process.

Embodiments disclosed herein reduce hydrostatic pressure in the melt and stabilize the meniscus. Both the elastic and buoyant properties of the sheet are used for stabilization while the sheet is kept horizontal within the melt in certain regions, such as where the sheet is formed in the melt. This provides an advantage over LASS because having the sheet float horizontally, as opposed to inclining it upward, avoids stress at the leading growth edge. Furthermore, using the elastic and buoyant forces allows the sheet formation region to be optimized independently of or be a distance upstream of the meniscus stabilization region. This optimization includes adjusting the thermal environment, such as the cooling plate or any heating systems. Finally, using elasticity and buoyancy avoids the need for complex angle control. The embodiments disclosed herein may not require flowing of the melt or only flow the melt at particular times, so crystal initialization can occur before melt flow. This simplifies crystal seeding. Furthermore, melt flow may be adjusted independently of the meniscus stabilization. Complicated gas jet control also is avoided.

An interface forms when a liquid is in contact with a gas. This interface follows the Young-Laplace Equation. In two dimensions, it takes the form:

$$\Delta P = \frac{\sigma}{R}$$

$$\frac{1}{R(x)} = \frac{\left|\frac{\partial^2 y}{\partial x^2}\right|}{\left(1 + \left(\frac{\partial y}{\partial x}\right)^2\right)^{3/2}}$$

where $\Delta P$ is the difference in pressure across the interface, $\sigma$ is the surface tension of the liquid, and R is the radius of curvature of the surface. The radius of curvature of the meniscus can be expressed in terms of the first and second derivatives of the line describing the meniscus.

Figure 3:
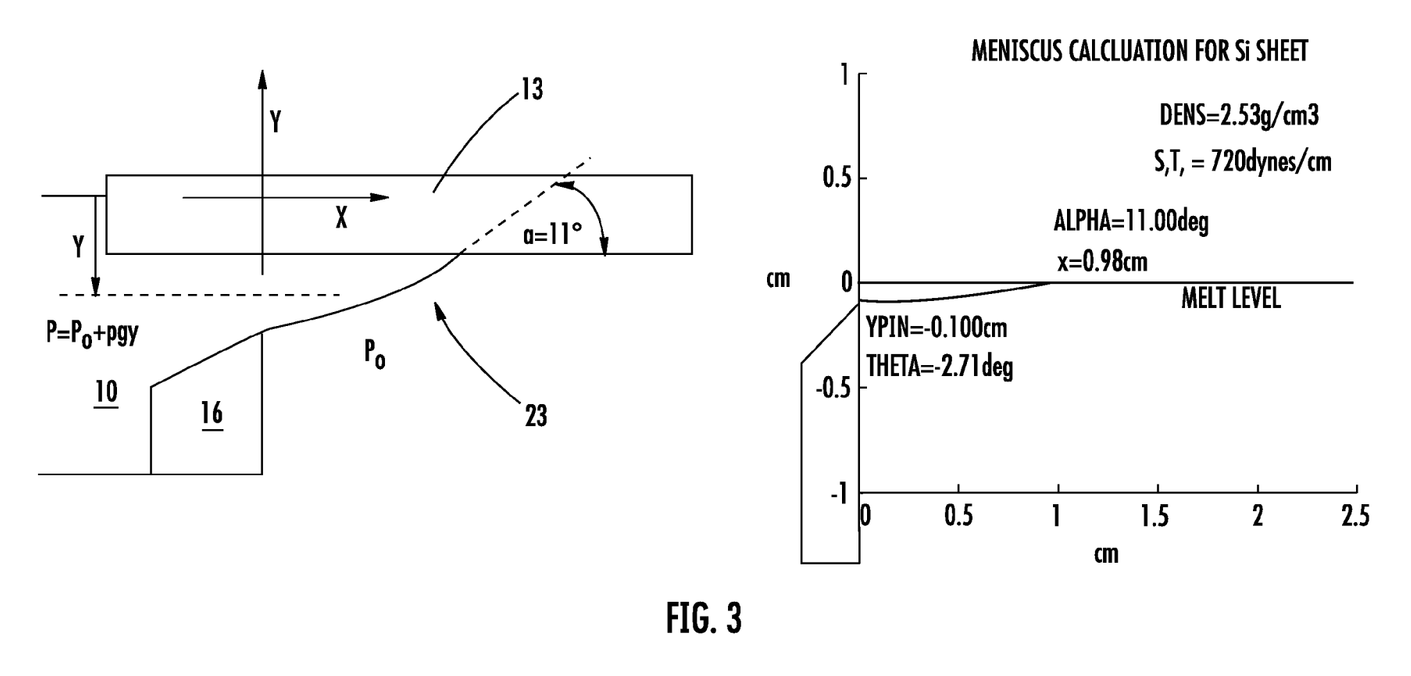
FIG. 3 is a cross-sectional side view of a meniscus joining the sheet to the crucible.

FIG. 3 is a cross-sectional side view of a meniscus joining the sheet to the crucible. The difference in pressure across the meniscus 23 is due only to the hydrostatic pressure in the melt 10 caused by gravity ($\rho gy$), so the Young-Laplace Equation becomes a second order differential equation:

$$\frac{\partial^2 y}{\partial x^2} = -\frac{1}{\sigma}(\rho gy(x))\left(1 + \left(\frac{\partial y}{\partial x}\right)^2\right)^{3/2}$$

This differential equation requires two boundary conditions. The meniscus 23 is pinned at the wall of the vessel 16, so its location is fixed at x=0. At the other end of the meniscus 23 where the meniscus 23 attaches to the sheet 13, the meniscus 23 is not pinned and the angle made with the sheet 13 is determined by the surface energy between solid and liquid silicon and the gas. For solid silicon in contact with its melt, the contact angle may be approximately 11°. Thus, $y_0$ is specified at x=0 and the contact angle at the other end. The initial contact angle at the vessel 16 and the location of the contact point with the sheet 13 are then determined by the solution to the differential equations. FIG. 3 shows one solution in the plot on the right. A convex solution is possible while maintaining the contact angle of 11° and while the melt 10 is above the wall of the vessel 16 by approximately 1 mm. If the melt 10 were higher than 1 mm above the wall of the vessel 16, the hydrostatic pressure may push out the meniscus 23 such that the contact angle would be >11° and the meniscus 23 would move outward. This may result in the melt 10 spilling over the edge of the vessel 16.

Figure 4:
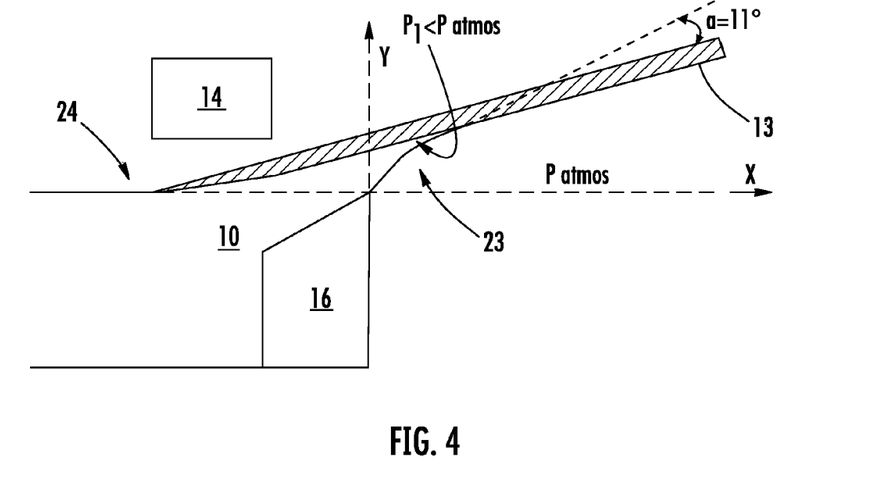
FIG. 4 is a cross-sectional side view of meniscus stabilization for an inclined sheet.

FIG. 4 is a cross-sectional side view of meniscus stabilization for an inclined sheet. Here the concave shape of the meniscus 23 is provided by the negative pressure ($P_1$) relative to the atmospheric pressure ($P_{atmos}$) that is created by lifting up and angling the sheet 13 relative to the surface of the melt 10, such as the surface 24. This allows a higher elevation of the sheet 13 at the edge of the vessel 16 than the freezing front of the sheet 13, which is at a lower elevation than the height of the melt 10. However, this inclination also lifts the freezing area as defined by the cooling plate 14. The vertical position of the sheet 13 may be controlled by the pulling device. The position and length of the cooling plate 14 is at least partly determined by the angle and height. This cooling plate 14 likely needs to be in close proximity to the edge of the vessel 16.

Figure 5:
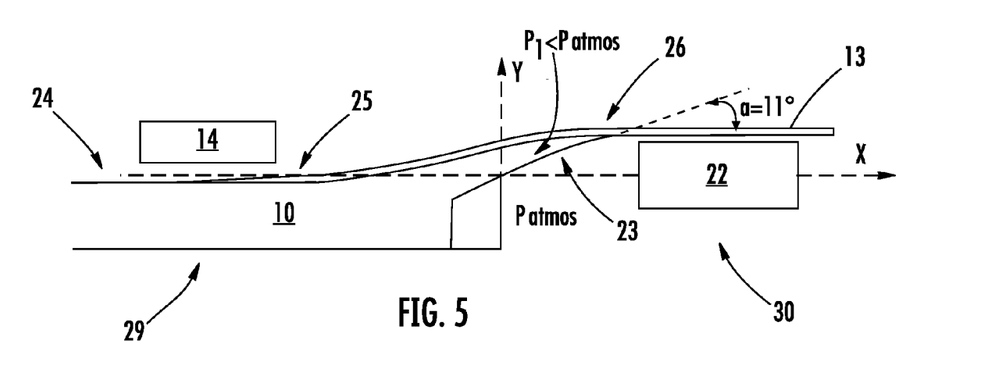
FIG. 5 is a cross-sectional side view of meniscus stabilization using the elasticity and buoyancy of the melt.

FIG. 5 is a cross-sectional side view of meniscus stabilization using the elasticity and buoyancy of the melt. The elasticity and buoyancy allow the sheet 13 to be pulled horizontally and be supported by a "support table" 22, which may be a gas bearing or gas table or may have rollers or some other mechanism known to those skilled in the art. Thus, the support table 22 may use a fluid force or a mechanical force to support the sheet 13. The support table 22 is above the level of the melt 10, which may be at the surface 24, but the freezing end of the sheet 13 is maintained horizontal on the melt 10 within the vessel 16. The sheet 13 may have a first sheet height 25 in a first region 29 proximate the cooling plate 14 and a second sheet height 26 that is higher than the first sheet height 25 after separation from the melt 10. This may be at, for example, a second region 30, though this second sheet height 26 may be elsewhere. The support table 22 may support the sheet 13 at this second sheet height 26. A minimum distance of the cooling plate 14 from the edge of the vessel 16 may be calculated, but constraints on the height of the support table 22 relative to the level of the melt 10 at surface 24 may be avoided. This support table 22 may have a curved top surface or partially curved top surface in one instance to match the curvature of the sheet 13 near the meniscus 23. Negative hydrostatic pressure may be used to stabilize the meniscus 23.

Figure 6:
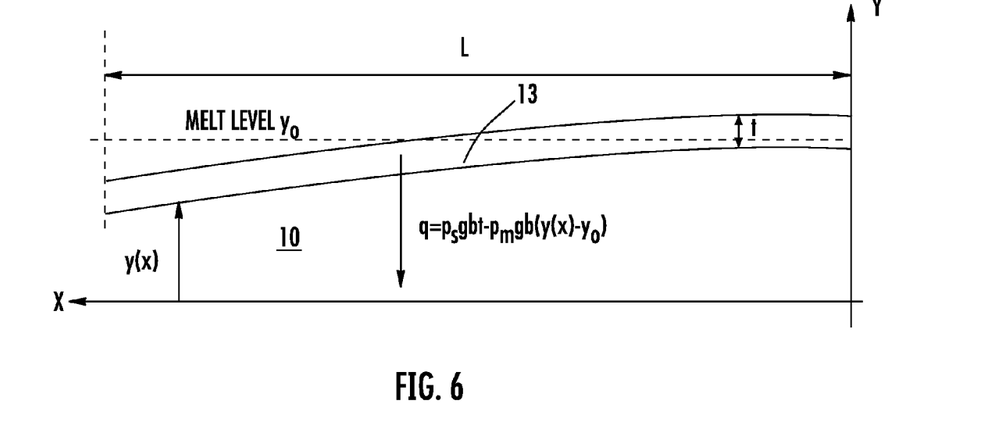
FIG. 6 is a cross-sectional side view of a silicon sheet in a silicon melt.

FIG. 6 is a cross-sectional side view of a silicon sheet in a silicon melt. The sheet 13 is in contact with the melt 10. The right end of the sheet 13 illustrated in FIG. 6 is raised at least partly above the surface of the melt 10 at $y_0$ (illustrated by the horizontal dotted line) while the left end of the sheet 13 is free and below $y_0$. The shape of the sheet 13 is determined by the vertical forces on the sheet 13, which includes gravity, as well as the hydrostatic force of the melt 10. Due partly to buoyancy, this hydrostatic force may be either upward or downward if the sheet 13 is lifted above its float point. The elasticity of silicon may cause the shape of the sheet 13 to be acted upon by the forces along the entire sheet 13. This shape may be defined as the vertical position y as a function of x in one instance.

This is described by the "beam deflection equation." In this equation. M is the bending moment along the beam or sheet 13, V is the shear along the beam or sheet 13, q is the distribution of force (N/m) along the beam or sheet 13, $I_z$ is the centroid moment of inertia, and E is the modulus of elasticity in the solid.

$$\frac{d^2y}{dx^2} = \frac{M(x)}{EI_z}$$

$$M(x) = \int_x^{beamend} V(x')dx'$$

$$V(x) = \int_x^{beamend} q(x')dx'$$

The curvature of the sheet 13 at x depends on the bending moment at x, which is determined by integrating the distributed force on the sheet 13 between x and the end of the sheet 13. Since this force includes buoyancy, the vertical position of the sheet 13 at each point (i.e., the shape) must be known to solve for the shape. This can be accomplished by an iterative or relaxation method. By first seeding this process with a polynomial representation of the shape of the sheet 13 $y_{poly}$(x), the $y_{integ}$(x) may be solved for using integration. By varying the polynomial coefficients, a value may be found that minimizes the difference between $y_{poly}$(x) and $y_{integ}$(x), which yields a solution.

Figure 7:
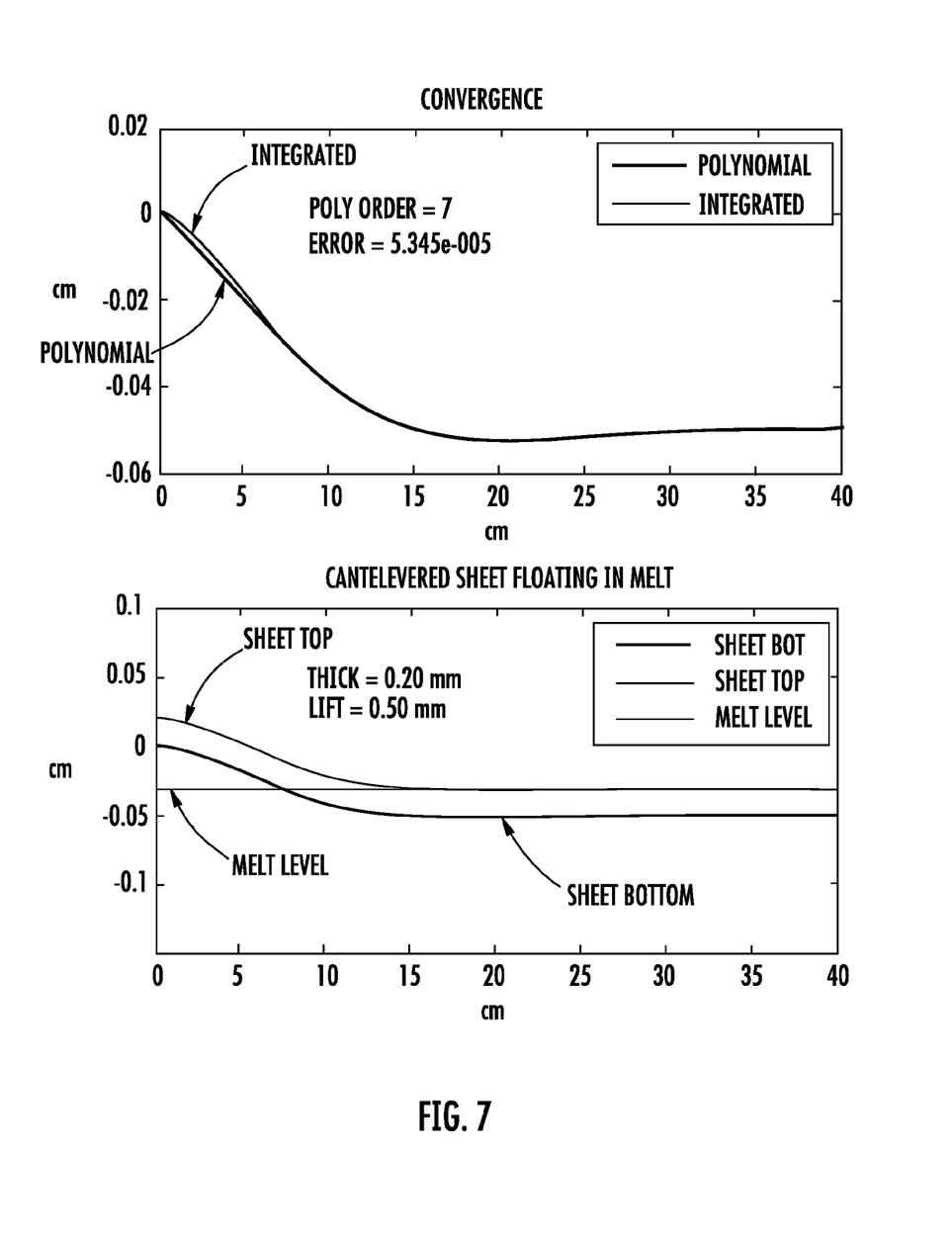
FIG. 7 illustrates a numerical solution to the beam deflection equation including buoyancy.

FIG. 7 illustrates a numerical solution to the beam deflection equation including buoyancy. FIG. 7 shows both the convergence of the solution as well as the resulting shape of the sheet 13. In this calculation, the sheet 13 is supported horizontally on the left side. The bending moment integrates the effect of buoyancy and, thus, the sheet 13 levels out to its floating level. The density of silicon was taken as 2.53 g/cm$^2$ and the elasticity of silicon was taken as 1.4E11 Pa.

By utilizing the elastic nature of silicon and its buoyancy in a silicon melt 10, the sheet 13 may be pulled or transported over the edge of the vessel with sufficient MI and while the sheet 13 is above the melt 10 surface. This produces a negative pressure and stabilizes the meniscus. The free end of the sheet 13 also may float horizontally on the surface of the melt 10, such as under a cooling plate. Thus, the sheet 13 may form without any net vertical force and dislocations can be reduced. The cooling plate also may be arbitrarily long and allow the sheet 13 to grow downward slowly while pulling horizontally at a particular speed. This also reduces stress on the sheet 13 and reduces the number of dislocations.

Figure 8:
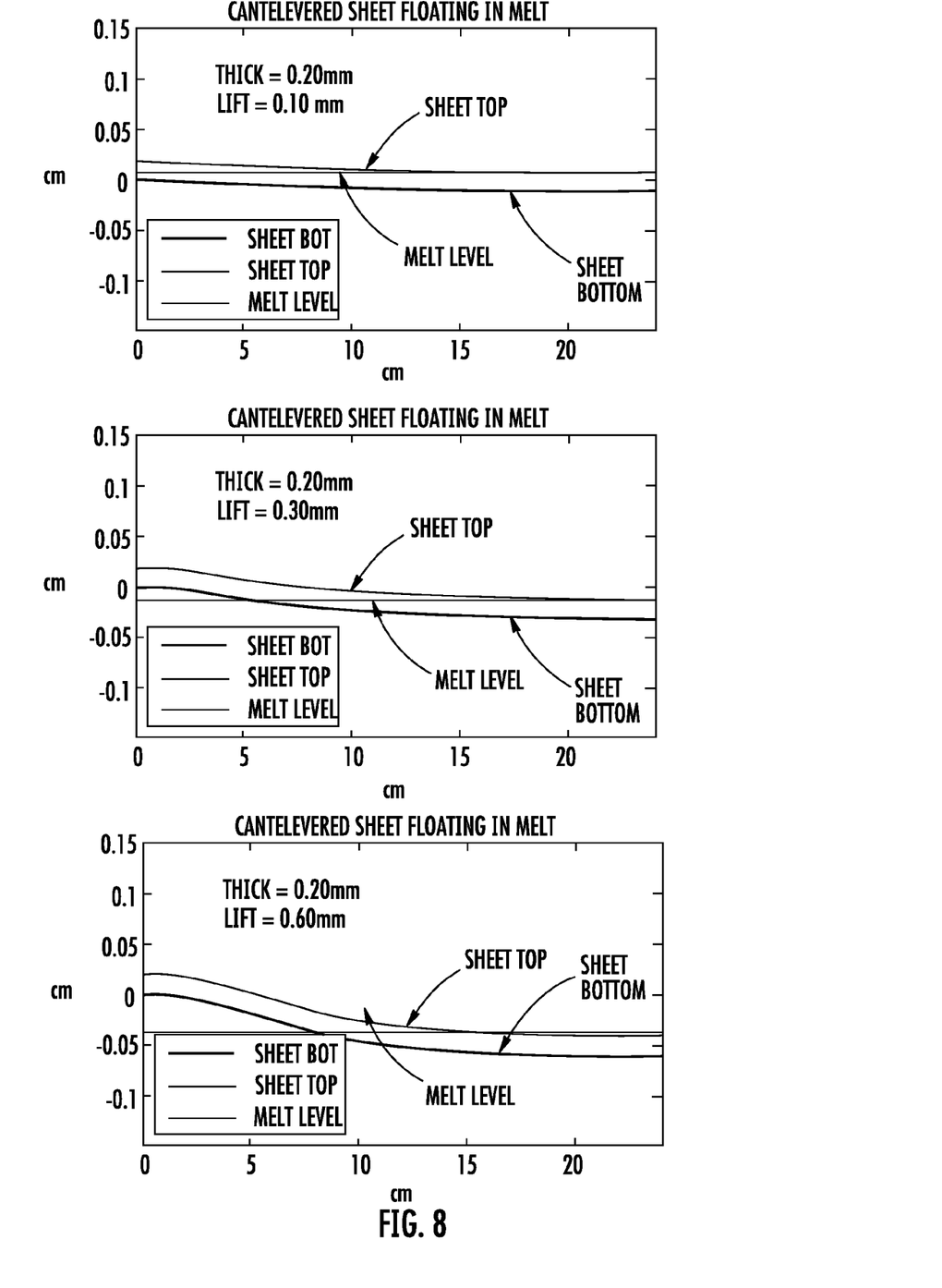
FIG. 8 illustrates the insensitivity of the minimum sheet length to lift.

For a particular sheet 13 thickness, a minimum sheet 13 length in the melt 10 may be calculated. For a 300 μm sheet 13 thickness, the sheet 13 should be approximately 32 cm in length. For a 200 μm sheet 13 thickness, the sheet 13 should be approximately 24 cm in length. For a 150 μm sheet 13 thickness, the sheet 13 should be approximately 20 cm in length. For a 100 μm sheet 13 thickness, the sheet 13 should be approximately 16 cm in length. Minimum sheet 13 lengths are relatively insensitive to lift height over the vessel edge. The higher the lift, the greater the hydrostatic force deflecting the sheet 13 downward. FIG. 8 illustrates the insensitivity of the minimum sheet length to lift. Thus, embodiments of this process may be self-correcting. In one particular embodiment, the lift is calculated such that the sheet remains floating on the surface of the melt during crystallization or freezing without being pushed under the melt surface.

Figure 9:
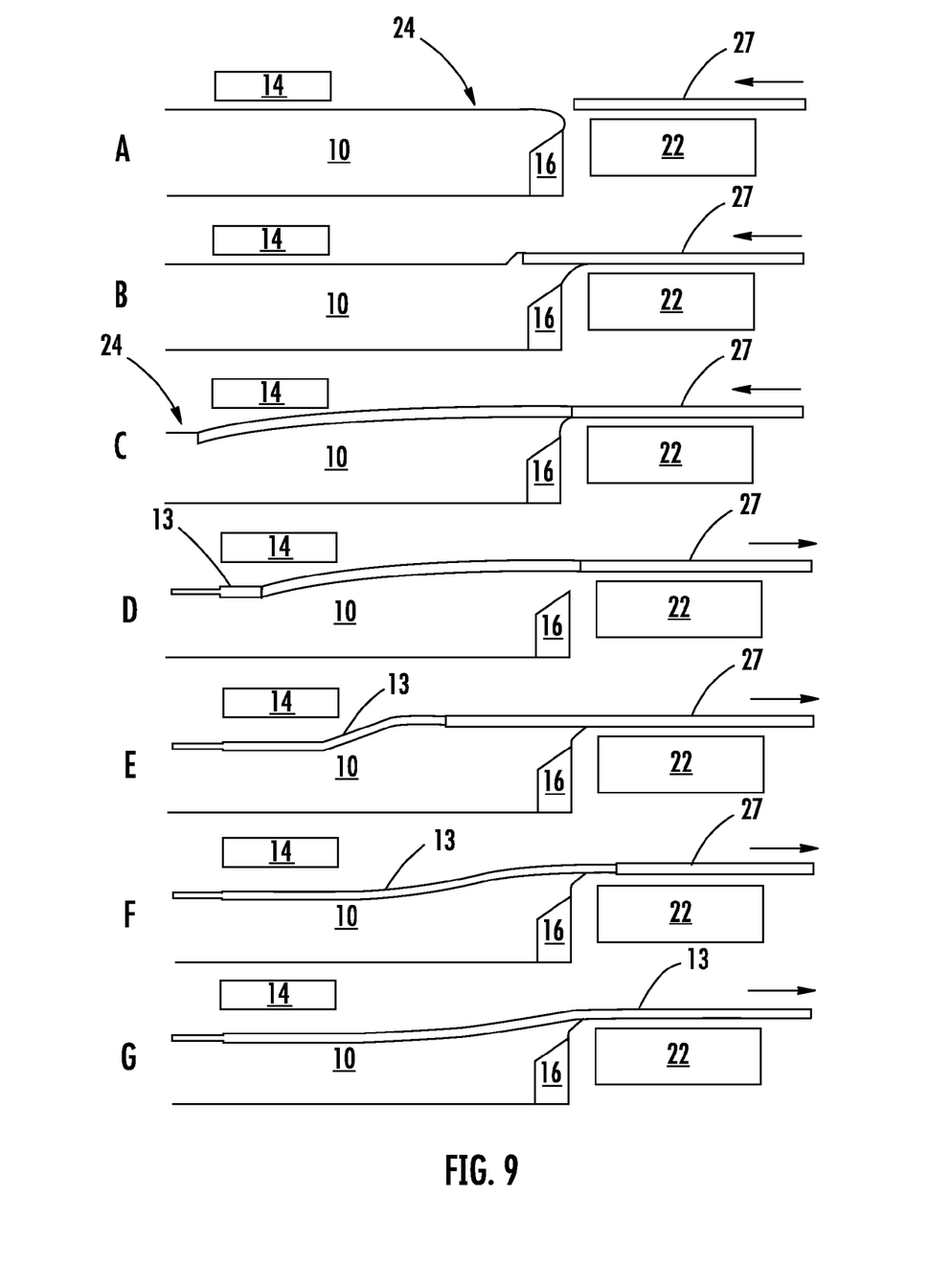
FIG. 9 illustrates a first embodiment for sheet initialization using elasticity and buoyancy.

FIG. 9 illustrates a first embodiment for sheet initialization using elasticity and buoyancy. Before the seed wafer 27 is inserted, the vessel 16, which may be quartz, is filled with a melt 10 to a level just above the edge of the vessel 16, forming a "mesa" of melt 10. This surface 24 has a first height in FIG. 9A. The level of this mesa formed by the melt 10 may be less than approximately 1 mm above the edge of the vessel 16 to prevent spills.

In FIG. 9B, the seed wafer 27 is inserted into the melt 10. This forms a meniscus both above and below the seed wafer 27. In FIG. 9C the level of the melt 10 is lowered. The surface 24 now has a second height that is lower than the first height. The seed wafer 27 has been translated to a region proximate or underneath the cooling plate 14. In FIG. 9D, a sheet 13 is initiated by lowering the temperature of the cooling plate 14. The sheet 13 is affixed to the seed wafer 27. As the sheet 13 is pulled, as illustrated in FIG. 9E, the elasticity of the sheet 13 lifts the sheet 13 upward on the melt 10.

In FIG. 9F, the sheet 13 is pulled away from the melt 10 or is separated from the melt 10. The negative pressure stabilizes the meniscus even after the sheet 13 passes the wall of the vessel 16. In FIG. 9G, the sheet 13 continues to be removed from the melt 10. The level of the melt 10 may be further lowered to ensure meniscus stability at steady state. The melt 10 may begin to flow at the point illustrated in FIG. 9G in one particular embodiment, though the melt 10 also may begin to flow at other times. The level of the melt 10 can be lowered during pulling of the sheet 13 while maintaining the floating horizontal nature of the sheet 13 under the cooling plate 14 if a minimum distance between the cooling plate 14 and the wall of the vessel 16 is maintained. This may be performed to ensure stabilization of the meniscus. In the embodiment of FIG. 9, the level and angle of the seed wafer 27 insertion or the support table 22 may not need to be adjusted during the seeding and pulling process for the sheet 13.

Figure 10:
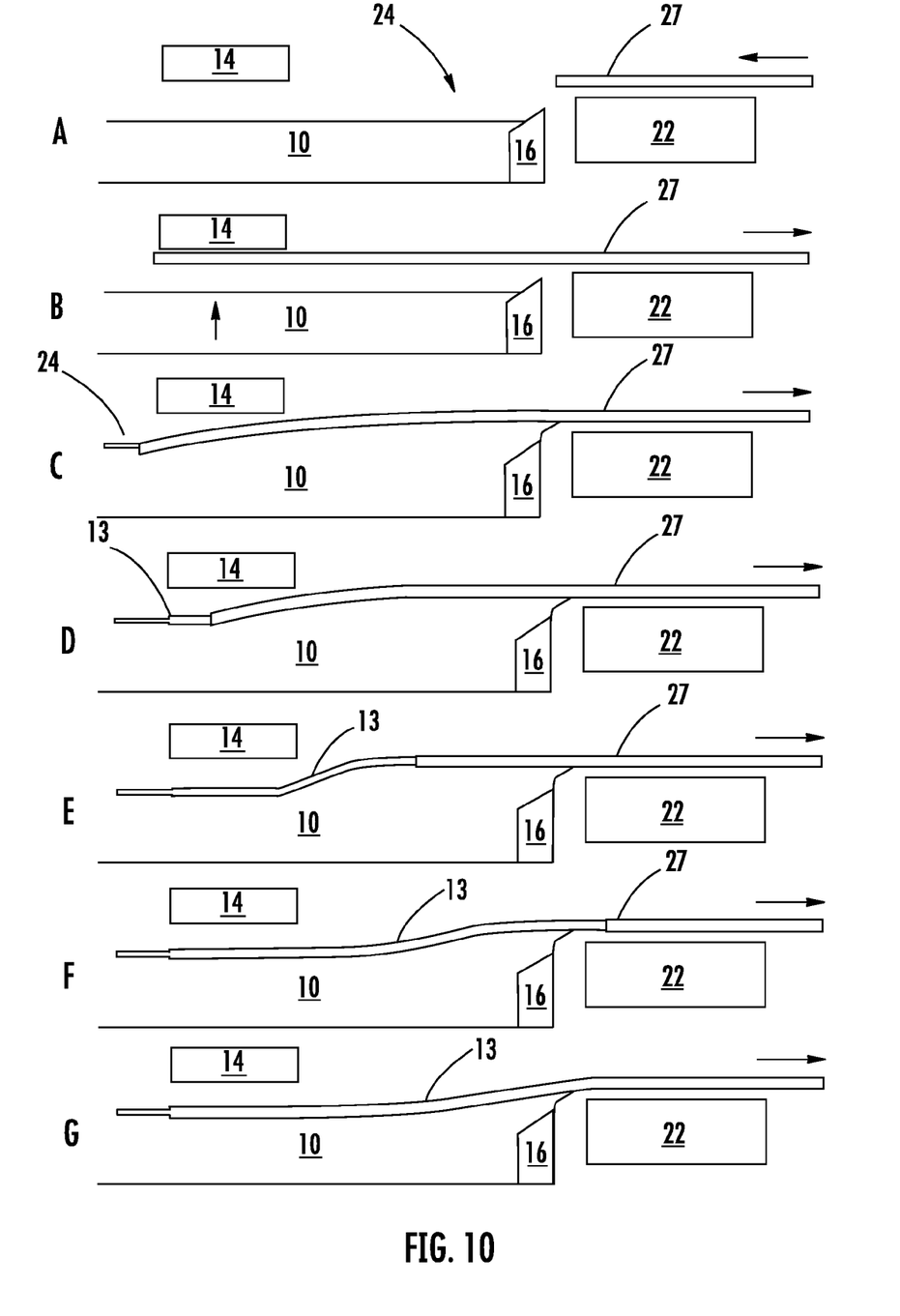
FIG. 10 illustrates a second embodiment for sheet initialization using elasticity and buoyancy.

FIG. 10 illustrates a second embodiment for sheet initialization using elasticity and buoyancy. In FIG. 10A, the vessel 16 is filled with a melt 10 to a level equal to or below the top of the wall of the vessel 16, which reduces the risk of spilling the melt. The surface 24 has a first height in FIG. 10A. The seed wafer 27 is cantilevered over the melt 10 and under the cooling plate 14 in FIG. 10B. The end of the seed water 27 is above the melt 10 at the leading edge of the cooling plate 14, before it is cooled to below the melt temperature. In FIG. 10C, the level of the melt 10 is raised and the surface 24 has a second height that is higher than the first height. The melt 10 level may be raised until the seed wafer 27 is wetted, which will pull the seed wafer 27 downward.

In FIG. 10D, the sheet 13 is initiated by lowering the temperature of the cooling plate 14 to below the melting temperature of the melt 10. The seed wafer 27 may begin being translated with the sheet 13. As seen in FIG. 10E, as the sheet 13 is pulled, the elasticity of the seed wafer 27 lifts the sheet 13 upward. In FIG. 10F, the sheet 13 is pulled away from the melt 10 or separated from the melt 10. The negative pressure stabilizes the meniscus even after the sheet 13 passes the wall of the vessel 16. In FIG. 10G, the sheet 13 continues to be removed from the melt 10. The level of the melt 10 may be further lowered to ensure meniscus stability at steady state. The melt 10 may begin to flow at the point; illustrated in FIG. 10G in one particular embodiment, though the melt 10 also may begin to flow at other times.

If the seed wafer 27 thickness is approximately 0.7 mm (which may correspond to the thickness of a 300 mm electronics grade wafer), the seed wafer 27 may have a cantilevered droop over 20 cm is less than 1 mm. In this case when the seed wafer 27 is not yet in contact with the melt 10, the equation may be solved in closed form to yield a maximum deflection of:

$$y_{max} = \frac{\rho g t b L^4}{8 E I_z}$$

The level of the melt 10 is then raised by, for example, inserting a quartz plunger into the melt or by adding more silicon, so that the melt 10 meets the seed wafer 27. Once the seed wafer 27 wets, the melt 10 is drawn under the seed wafer 27 to form a meniscus that attaches to the wall of the vessel 16. Since the seed wafer 27 is above the melt 10 level, there is a reduced pressure at the meniscus. A concave shape may be formed and stabilization of the meniscus may occur. Once pulling or transport of the sheet 13 has commenced, flow can be initiated in the melt 10 to stabilize crystallization. In one particular embodiment, the melt 10 may flow at all times and translation of the seed wafer 27 may begin after the melt 10 level is raised.

Figure 11:
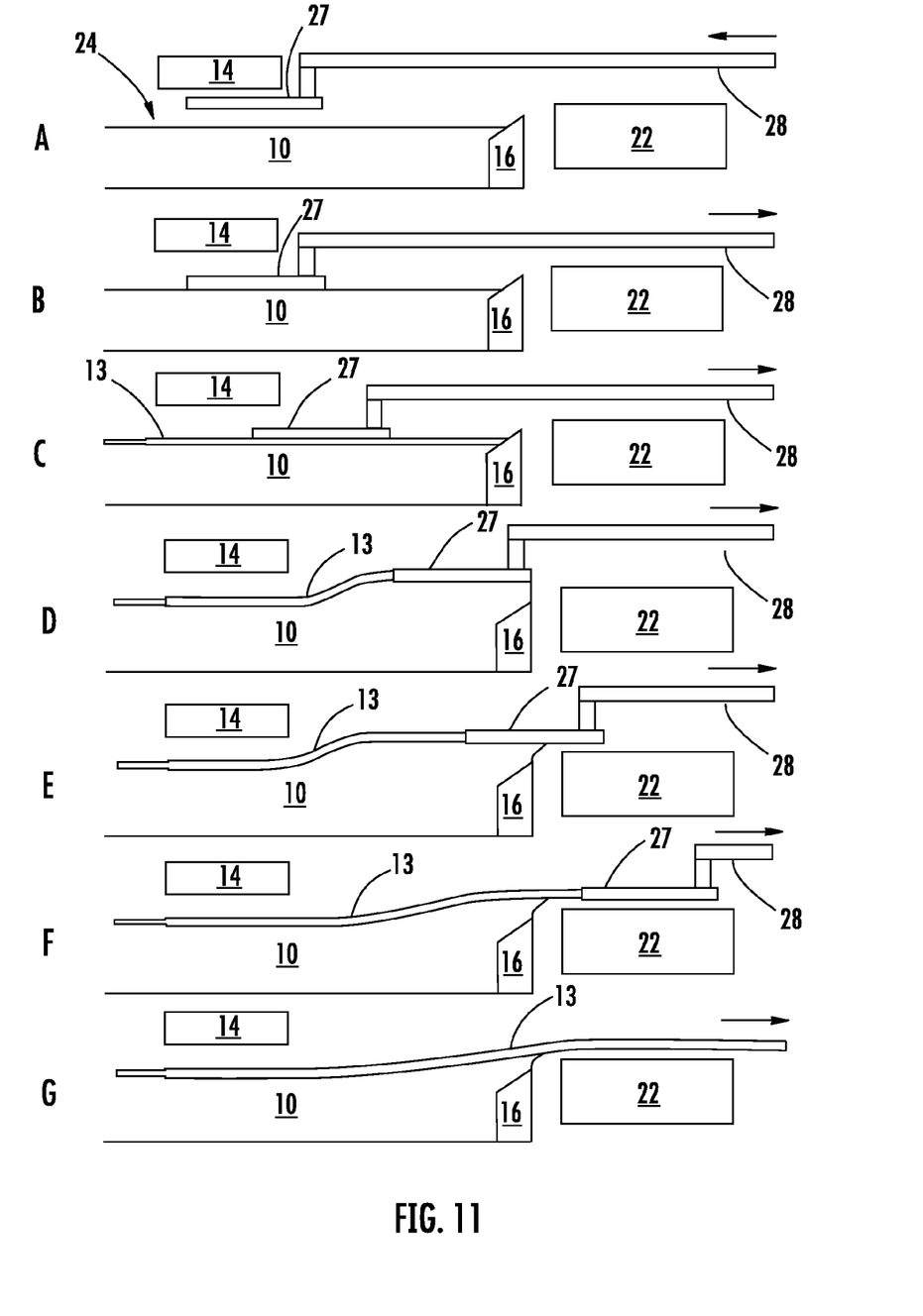
FIG. 11 illustrates a third embodiment for sheet initialization using elasticity and buoyancy.

FIG. 11 illustrates a third embodiment for sheet initialization using elasticity and buoyancy. In FIG. 11A, the vessel 16 is filled with a melt 10 below or equal to the height of the edge of the vessel 16. The surface 24 has a first height in FIG. 11A. The seed wafer 17 is held by a seed holder 28 that can lower the seed wafer 27 into the melt 10 and translate the seed wafer 27 in other directions. In this case, the seed wafer 27 is only approximately as long as the cooling plate 14, though other lengths are possible. The seed wafer 27 is moved under the cooling plate 14 in FIG. 11A where the seed wafer 27 cools below the temperature of the melt 10. The seed wafer 27 is then lowered into the melt 10 in FIG. 11B and horizontal pulling or transportation is initiated in FIG. 11C. The sheet 13 is formed and is attached to the seed wafer 27. The temperature of the cooling plate 14 may be lowered in one instance after the seed wafer 27 contacts the melt 10 to assist in sheet 13 formation. Before the seed holder 28 or seed wafer 27 reaches the wall of the vessel 16, it is raised as seen in FIG. 11D and, in thin, the seed wafer 27 and sheet 13 are raised upward. This raising creates reduced pressure beneath the sheet 13 and stabilizes the meniscus formed at the wall of the vessel 16 as the seed wafer 27 and sheet 13 pass over the wall of the vessel 16. As seen in FIG. 11E, as the sheet 13 is pulled, the elasticity of the seed wafer 27 lifts the sheet 13 upward. In FIG. 11F, the sheet 13 is pulled away from the melt 10 or separated from the melt 10. The negative pressure stabilizes the meniscus even after the sheet 13 passes the wall of the vessel 16. In FIG. 11G, the sheet 13 continues to be removed from the melt 10. The level of the melt 10 may be further lowered to ensure meniscus stability at steady state. The melt 10 may begin to flow at the point illustrated in FIG. 11G in one particular embodiment, though the melt 10 may be flowing throughout the process of FIG. 11 in an another embodiment.

While FIGS. 9-11 do not use the spillway as illustrated in FIG. 1, alternate embodiments can use this spillway. In such a case, the melt will flow over the spillway but a meniscus will still form with the seed wafer or sheet.

Embodiments of this method may require a minimum distance between the edge of the vessel and the cooling plate depending on the sheet thickness. The silicon's elasticity or buoyancy then decouples the meniscus stabilization over the wall of the vessel from the crystallization under the cooling plate. The region where crystallization or freezing occurs can be decoupled or separated from the region where separation from the melt occurs. Both regions can have thermal properties optimized or have different thermal conditions without impacting the other. For example, the freezing temperature may be optimized in one region and the other may be kept isothermal. This also enables the sheet to be pulled or translated horizontally, potentially without spilling the melt. Pulling or translating a sheet horizontally avoids stress at the leading edge of the sheet. No angle adjustments may be needed during seeding, pulling, or transportation of the melt or sheet. The sheet may remain horizontal and floating under the cooling plate without any net vertical stresses, which improves the quality of the sheet and reduces dislocations in the crystal. The melt flow speed may be independent of the sheet pull or transportation speed, which may enable the melt flow to be set to zero during the crystal initialization process. This simplifies the seeding process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view or the full breadth and spirit of the present disclosure as described herein.

What is claimed is:

1. A method of sheet production comprising:
cooling a melt of a material to form a sheet of said material on a surface of said melt in a first region at a first sheet height;
translating said sheet horizontal to said surface of said melt and raising a first portion of said sheet vertically from said surface of said melt such that said first portion of said sheet is disposed in a second region and a second portion of said sheet is disposed in said first region, wherein said first portion of said sheet has a second sheet height, said second portion of said sheet has a first sheet height, said first sheet height being lower than said second sheet height, and said first portion of said sheet being parallel to said second portion of said sheet; and
separating said sheet from said melt in said second region at said second sheet height.

2. The method of claim 1, wherein said material is silicon or silicon and germanium.

3. The method of claim 1, further comprising flowing said melt and said sheet.

4. The method of claim 1, further comprising supporting said sheet at said second sheet height after said separating using at least one of a fluid force or a mechanical force.

5. A method of sheet production comprising:
inserting a seed wafer into a melt of a material, wherein said melt has a surface at a first height that is higher than an edge of a vessel containing said melt;
translating said seed wafer in said melt to a region proximate a cooling plate;
lowering said surface of said melt to a second height below said first height;
forming a sheet of said material on said melt using said seed wafer in said region;
translating said sheet and said seed wafer horizontal to said surface of said melt and raising a first portion of said sheet vertically from said surface of said melt such that said first portion of said sheet is disposed at said first height and a second portion of said sheet is disposed at said second height, wherein said first portion of said sheet is parallel to said second portion of said sheet; and
separating said sheet from said melt at an edge of said vessel.

6. The method of claim 5, wherein said material is silicon or silicon and germanium.

7. The method of claim 5, further comprising flowing said melt and said sheet.

8. The method of claim 5, further comprising supporting said sheet at said first sheet height after said separating using at least one of a fluid force or a mechanical force.

9. A method of sheet production comprising:
inserting a seed wafer into a melt of a material at a first region, wherein said melt at said first region has a surface at a first height that is equal to or lower than an edge of a vessel containing said melt;
translating said seed wafer to a second region proximate a cooling plate;
forming a sheet of said material on said melt using said seed wafer in said second region, wherein said sheet has a first sheet height proximate said second region;
translating said sheet and said seed wafer horizontal to said surface of said melt and raising a first portion of said sheet vertically from said surface of said melt to said first region, wherein said first portion of said sheet has a second sheet height proximate said first region, with said first sheet height being lower than said second sheet height and said first portion of said sheet being parallel to a second portion of said sheet proximate said second region; and
separating said sheet from said melt at said second sheet height, wherein said sheet has at least said second sheet height after said separating.

10. The method of claim 9, wherein said material is silicon or silicon and germanium.

11. The method of claim 9, further comprising flowing said melt and said sheet.

12. The method of claim 9, further comprising supporting said sheet at said second sheet height after said separating using at least one of a fluid force or a mechanical force.

13. The method of claim 9, further comprising raising said surface to a second height higher than said first height prior to said forming.

14. The method of claim 9, wherein raising a first portion of said sheet vertically comprising raising said seed wafer.

15. The method of claim 9, wherein said translating comprises translating said seed wafer in said melt.

16. The method of claim 1, wherein translating and raising said sheet causes a meniscus to form between said sheet and said melt, said meniscus disposed between said first portion of said sheet and said second portion of said sheet, and wherein said meniscus is oriented at an angle with respect to an upper surface of said sheet.

17. The method of claim 16, wherein said first sheet height is less than 1 mm lower than said second sheet height, and said angle is about 11 degrees.

18. The method of claim 1, wherein a difference between said first sheet height and said second sheet height is determined based at least in part on a thickness of said sheet.

19. The method of claim 5, wherein translating and raising said sheet causes a meniscus to form between said sheet and said melt, said meniscus disposed between said first portion of said sheet and said second portion of said sheet, and wherein said meniscus is oriented at an angle with respect to an upper surface of said sheet.

20. The method of claim 9, wherein translating and raising said sheet causes a meniscus to form between said sheet and said melt, said meniscus disposed between said first portion of said sheet and said second portion of said sheet, and wherein said meniscus is oriented at an angle with respect to an upper surface of said sheet.

* * * * *